United States Patent [19]
Anderson et al.

[11] Patent Number: 5,811,184
[45] Date of Patent: Sep. 22, 1998

[54] DOUBLE-FACED ADHESIVE FILM PARTICLE GETTER

[75] Inventors: Edward A. Anderson, Tustin; Mitchell T. Hatai, Lakewood; Mehrdad Mohtasham, Torrance, all of Calif.

[73] Assignee: Hughes Electronics Corporation, Los Angeles, Calif.

[21] Appl. No.: 655,264

[22] Filed: Jun. 4, 1996

[51] Int. Cl.$^6$ .............................. C09J 7/02; B65D 85/86
[52] U.S. Cl. .................... 428/343; 206/701; 206/706; 206/726; 428/354
[58] Field of Search .................................. 428/343, 354; 206/701, 706, 726

[56] References Cited

U.S. PATENT DOCUMENTS

| | | |
|---|---|---|
| 4,470,508 | 9/1984 | Yen . |
| 4,629,640 | 12/1986 | Akao . |
| 5,208,103 | 5/1993 | Miyamoto et al. . |
| 5,277,972 | 1/1994 | Sakumoto et al. . |
| 5,304,419 | 4/1994 | Shores . |
| 5,346,765 | 9/1994 | Maeda et al. . |

OTHER PUBLICATIONS

Allison, D.M., "Find Getter Analysis Report", *IEEE*, 1985, pp. 355–358.

Campbell, Jr., W.A., et al., "Outgassing Data for Selecting Spacecraft Materials", *NASA Reference Publication 1124 Revised*, 1987, pp. 1–3.

King, J., "Use of Silicone Gel Particle Getters for Microcircuit Packaging", *Proceedings of the Intenational Society of Hybrid Microelectonics*, pp. 1985, 322–325.

Shores, Dr., A.A., et al., "Effective Gettering Materials for Hermetic Packages", *ISHM '92 Proceedings*, pp. 47–51.

*Primary Examiner*—Jenna Davis
*Attorney, Agent, or Firm*—Elizabeth E. Leitereg; Terje Gudmestad; Michael W. Sales

[57] ABSTRACT

A particle getter is presented for protecting electronic circuitry from damage caused by particles or debris. An adhesive film is used to capture and retain particles, such as solder balls and wire trimmings, that pose a danger to the functioning of electronic circuitry, and thereby prevent short circuits and other malfunctions. The particle getter does not interfere with access to the circuitry, and thus may be used when conformal coating is not practicable. The particle getter is particularly useful for protecting electronic circuitry aboard a spacecraft, since particles that can cause a circuit malfunction float freely in the zero-gravity environment, where they can be captured and retained by the getter. The preferred adhesive film is space-qualified, and has outgassing properties that are within limits imposed by NASA specifications. The particle getter has applications in many places where debris is present, both in space and earthbound.

16 Claims, 3 Drawing Sheets

DOUBLE-FACED ADHESIVE FILM PARTICLE GETTER

This invention was made with Government support under contract No. F4701-92-C-0049 awarded by the United States Air Force. The government has certain rights in this invention.

BACKGROUND OF THE INVENTION

1. Field of the Invention

This invention relates to particle getters, particularly those types of particle getters used to protect electronic circuitry aboard a spacecraft.

2. Description of the Related Art

Electronic circuits, particularly circuit boards that are densely-packed with components, are susceptible to malfunction from particles or debris that land on the circuit and interferes with its operation. Of particular concern is conductive debris, such as solder balls or wire clippings, that can easily cause a short circuit between closely-spaced leads. Such a short circuit can cause serious damage to a circuit, typically requiring either extensive rework or disposal of the board on which the circuit resides. If the circuit is aboard a spacecraft, such as a satellite, such a debris-induced failure is catastrophic, since rework or replacement of a failed circuit is not a practical option.

One method of protecting a circuit from debris is known as "conformal coating." This method encapsulates a fabricated circuit within a protective shell, so that debris, fingerprints, or water vapor cannot contact the circuitry. This method is very effective, and is used extensively in the electronic circuit fabrication industry.

A problem arises, however, when conformal coating is not an available option. A circuit may require that a lead or connection point be accessible after its fabrication is complete, or it may be necessary or desirable to have the ability to plug and unplug component leads into board-mounted sockets. Here, conformal coating is not an option because once coated, sockets and components are trapped under the coating. Attempting to coat a board containing sockets may also cause the coating material to seep into the sockets and interfere with their operation. Heat dissipation for components sealed within a conformal coating may also be a concern. Even if these problems did not exist, conformal coating is a costly, time-consuming process that a circuit manufacturer may wish to avoid.

Another circuitry protection option is the use of a particle "getter." A particle getter is a tacky substance that is placed in an area in which the presence of particles and debris is a concern, such as near electronic circuitry; unwanted particles and debris that contact the getter stick to its surface. One substance used as a getter is Sylgard 527, a silicone dielectric gel from Dow Corning. This gel has been used as a particle getter in hermetically-sealed hybrid packages. Using this product requires that two compounds first be mixed together to form the gel. A pointed tool is then used to apply small closely-spaced dots of the gel, one dot at a time, to an area such as a hybrid package lid. After application, the gel must be cured for a period of time at an elevated temperature. Use of Sylgard 527 as a particle getter is discussed in J. King, "Use of Silicone Gel Particle Getters for Microcircuit Packaging," Proceedings of the International Society of Hybrid Microelectronics (1985), pp. 322–325.

Though Sylgard 527 has been proven effective as a getter when applied in a hermetically-sealed package, it may be unusable in some applications. For example, when a product is used in a non-hermetically-sealed environment aboard a spacecraft, the product's outgassing properties must typically be within NASA specifications. Excessive outgassing can result in gas emitted by a product recondensing on critical mechanical or optical surfaces, impairing their function. NASA specification SP-R-0022A establishes a maximum outgassing requirement for non-hermetically sealed applications that Sylgard 527 has been shown to exceed, rendering it unfit as a getter in such applications. Also, Sylgard 527 tends to spread after application. If the gel comes into contact with mechanical or electronic components, it can have a debonding or dewetting effect. Furthermore, the time and temperature required to cure the gel may impose costs on a manufacturer that are unacceptable.

SUMMARY OF THE INVENTION

A simple and inexpensive particle getter is presented for protecting electronic circuitry from damage caused by debris or particles. The getter provides an effective alternative to conformal coating and its low outgassing properties make it particularly well-suited to space applications.

An adhesive film is used for the novel purpose of capturing and retaining particles that pose a danger to the functioning of electronic circuitry, rather than its usual function of securing components to a particular location. The film is preferably positioned close to one or more circuit boards. Particles and debris that contact the film are captured and retained, preventing them from harming the nearby boards. By capturing particles such as solder balls and wire trimmings, short circuits and other malfunctions are averted that might otherwise cause catastrophic damage to the circuitry.

The particle getter may be used in situations in which conformal coating is undesirable or not practicable. For example, it may be necessary to maintain access to sockets located on a circuit board, so that components or hybrids may be removed and installed as needed. Using the getter maintains such access, while a conformal coating prevents it. The processing time and expense associated with conformal coating are also eliminated; they are replaced with a low-cost adhesive film that is easily installed where needed.

A preferred application of the invention is within an electronic circuitry enclosure aboard a spacecraft, such as a satellite. Circuit boards are placed within a box-shaped enclosure. The adhesive film particle getter is applied in strips to the interior surfaces of the enclosure not reserved for circuitry, preferably on the underside of the enclosure's lid. Particles that can cause a circuit malfunction float freely about the enclosure due to the zero-gravity environment. When these particles contact the getter, they are captured and retained so that they cannot damage the circuitry.

The preferred adhesive film is highly tacky, and remains so for years. The preferred adhesive film is also space-qualified, having outgassing properties that are within limits imposed by NASA specifications. In addition to being used as a particle getter within electronic circuitry enclosures, the getter may be placed in many other places where debris is present. For example, it could be useful positioned on the interior walls of a satellite between instrumentation packages, reducing the amount of debris freely floating around the spacecraft. It could also be used as an earthbound getter, particularly if positioned beneath circuitry to be protected, so that gravity tends to urge particles into contact with the film. Also, circuitry that must be vibration or shock tested, or survive a space launch, benefits from use of the getter, since the vibration can cause potentially dangerous particles to contact and be captured by the film.

Further features and advantages of the invention will be apparent to those skilled in the art from the following detailed description, taken together with the accompanying drawings.

DETAILED DESCRIPTION OF THE INVENTION

Figure 1A:
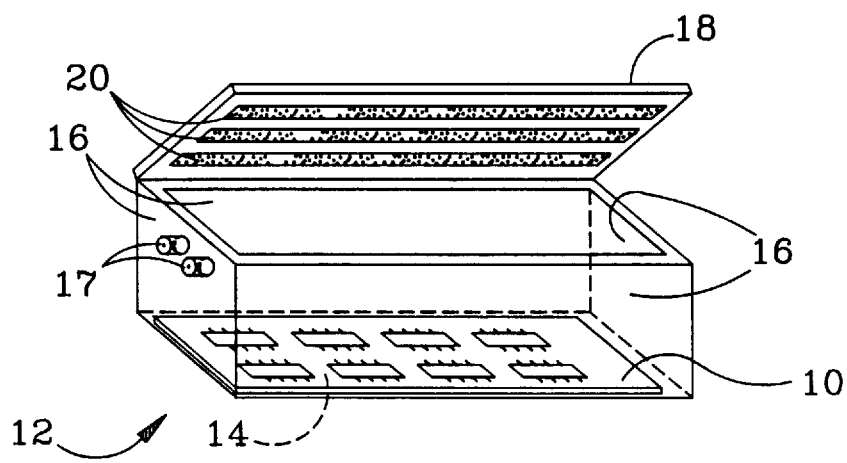
FIGS. 1a, 1b, 2, 3 and 4 are perspective views of the present invention in spacecraft, earthbound, dual circuit board and spacecraft applications, respectively.
Figure 1B:
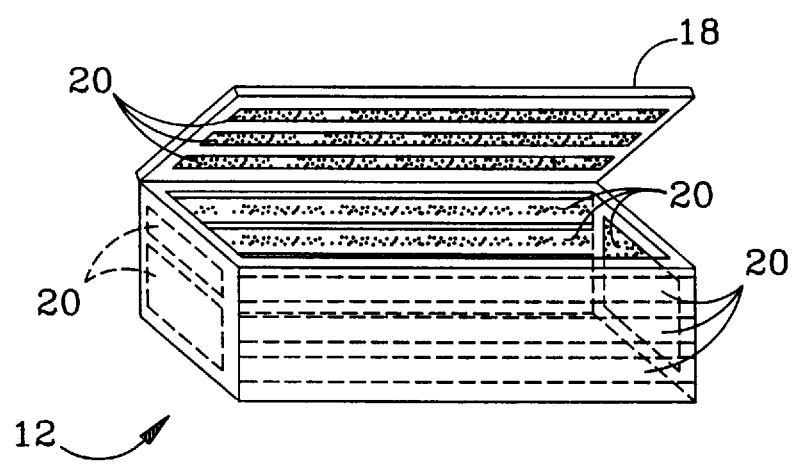

An application of the particle getter as described herein is shown in FIG. 1a. An electronic circuit resides on a circuit board 10. Circuitry is located within a preferably box-shaped electronic circuitry enclosure 12 comprising a base 14, four walls 16, several bulkhead connectors or feedthroughs 17 and a lid 18. To protect the circuitry 10 from particles and debris that can land on the circuitry and cause it to malfunction, a particle getter 20 is included within the enclosure 12. The particle getter, preferably one or more strips of a double-faced adhesive film, is applied to the circuitry-side (i.e., the "underside") of the enclosure lid 18. Since the film is double-faced, one face will adhere to the underside of the lid and the other face will be exposed and available for capturing particles. As shown in FIG. 1b (circuitry and feedthroughs not shown), adhesive film 20 may be adhered to other interior surfaces as well, such as the walls 16 of the enclosure, or other areas not used for circuitry, as long as the film does not interfere with the assembly or operation of the enclosed circuitry. The preferred adhesive film is extremely tacky and maintains its tackiness for years. Thus, particles and debris that contact the film are very likely to be captured and retained by the film.

The preferred adhesive film has been in use for some time for the purpose of mounting components, such as battery packs or heat straps, to a particular location aboard a spacecraft. When used for this purpose, first both the surface of the component and the surface it will be mounted to need to be thoroughly cleaned. The film is then carefully applied to the component. Next, the component is firmly pressed against the surface to which it is being mounted. This step often leads to air bubbles being trapped beneath the film, which can weaken the strength of the bond. Therefore, the air bubbles must be worked out as the component is being pressed into position. This procedure requires a considerable amount of manual manipulation in order to obtain a bond that is strong and reliable.

The successful use of the preferred adhesive film as a particle getter was an unexpected surprise to the inventors. Since the amount of force by which a particle might come into contact with such a film is so small— several orders of magnitude less than is present when firmly pressing a component into a particular location as discussed above—it was initially doubted that such a film would work as a getter. A series of feasibility tests were performed whereby small particles such as solder balls and wire trimmings were sprinkled over the preferred film such that the particles contacted the film with a very light force. A high percentage of the particles were successfully captured and retained by the film. Additional tests comparing the effectiveness of the preferred adhesive film with established particle getter Sylgard 527 established that the film offers superior performance with particles likely to be found near electronic circuitry, such as solder balls and wire clippings, and that the film is much easier to use. In this way, the inventors discovered the film's usefulness as an effective particle getter, despite the fact that the very small forces involved are much lower than those found in the film's usual application.

Figure 2:
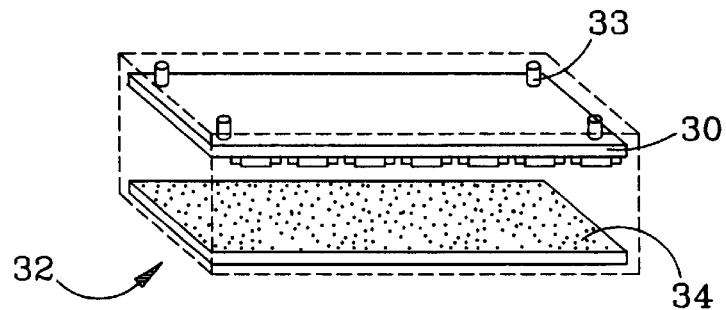

There are several means by which particles may come into contact with the particle getter. When such an enclosure is used aboard a satellite, for example, particles will be free-floating due to the zero-gravity environment. When such particles contact the getter attached to the enclosure lid, they are caught and rendered harmless. When used on land, particles may contact the getter with the help of gravity or vibration. The launch of a spacecraft is one situation in which the vibration generated could cause particles to contact the getter. FIG. 2 shows an application in which gravity helps to urge potentially troublesome particles into contact with the getter. A circuit board 30, typically within an enclosure 32 and in an environment in which gravity is present, is mounted to the lid of the enclosure, typically with standoffs 33, with the components facing downward so that debris near the components falls downward. One or more strips of adhesive film 34 make up a particle getter positioned beneath the board 30; debris that emanates from the board or a neighboring area and contacts the getter 34 is captured and retained.

Figure 3:
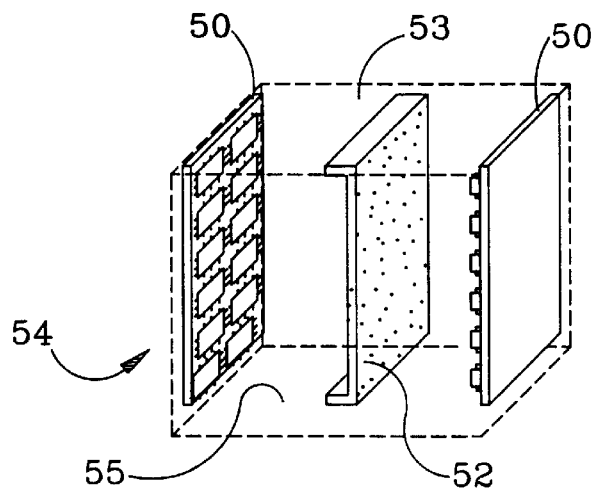

Another application is shown in FIG. 3, in which two circuit boards 50 are positioned on opposite sides of a double-faced adhesive film particle getter 52 that is placed between them. The getter is positioned by adhering a portion of one tacky face to the top surface 53 of an enclosure 54 and a portion of one tacky face to the bottom surface 55. This configuration is effective in a zero-gravity environment, capturing free-floating particles, as well as on land, capturing particles generated in normal use, via vibration or shock testing, or during a space launch.

Placing the circuitry and particle getter within an enclosure is recommended, because an enclosure protects the boards, reduces the amount of debris to which the boards are exposed, and provides mounting surfaces for the boards and the getter.

Figure 4:
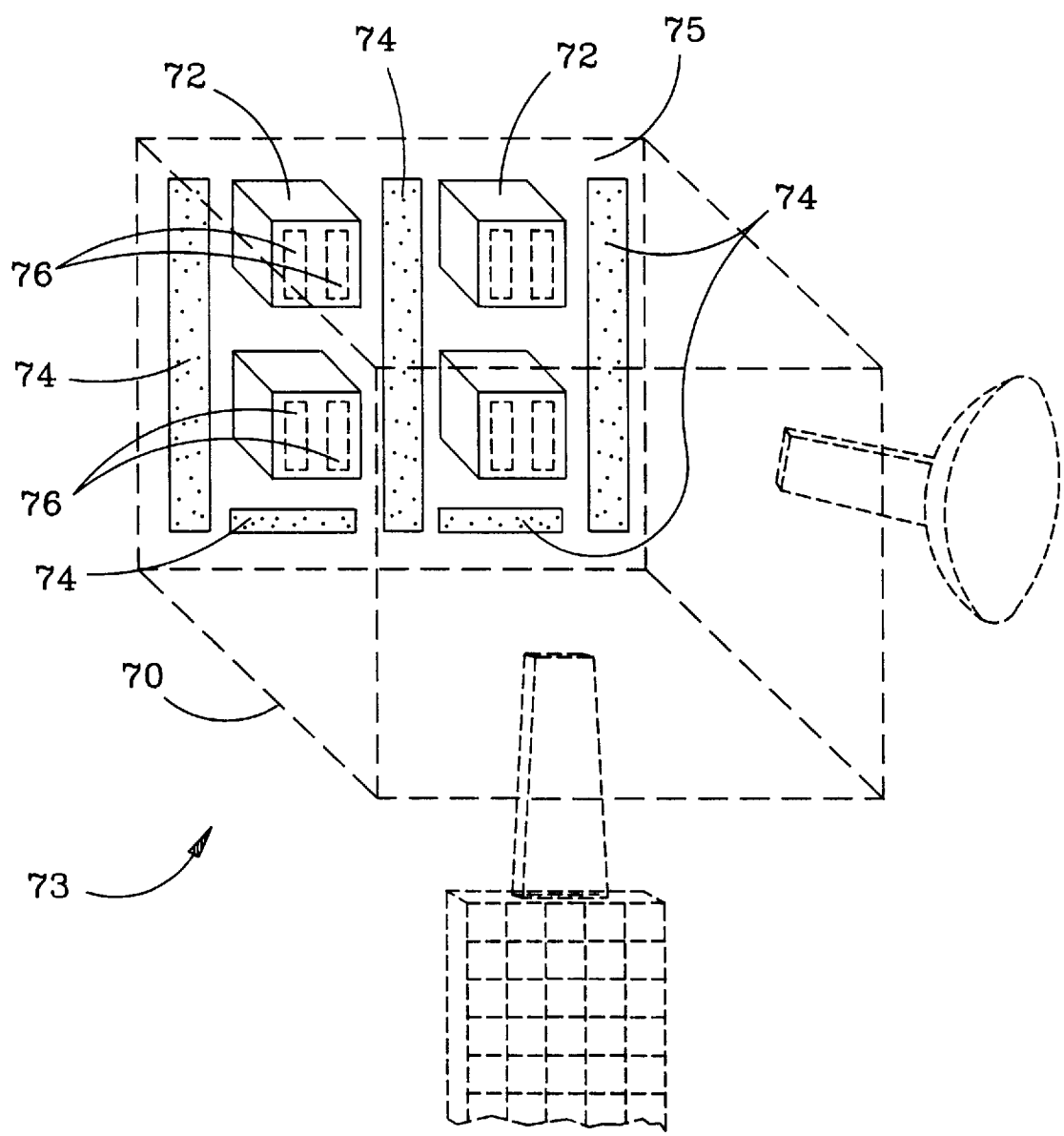

FIG. 4 depicts an application of the invention outside of an electronic circuitry enclosure, but within a confined space in which small particles are a concern. A compartment 70 having a number of walls and forming a confined space is used to hold a number of instrumentation packages 72, as on a satellite 73. To reduce the amount of debris floating around the compartment 70, one or more strips of adhesive film 74 is adhered to a compartment wall 75 between. and around the packages 72. Preferably, adhesive film 76 is used on the insides of the packages 72, as discussed above and shown in FIGS. 1, 2 and 3, with additional adhesive film 74 outside the packages. This provides two levels of protection from debris.

The particle getter may be used in many situations in which airborne debris is a concern. For example, the getter might be used on the walls of a clean room or an operating room to capture and retain some of the larger particles that might be present in these environments. The particle getter is not, however, intended for capturing microscopic debris or organisms.

When the particle getter is used aboard a spacecraft, its outgassing properties may be a consideration. If not contained within a hermetically-sealed enclosure, the adhesive film used may be required to meet a NASA outgassing specification such as NASA SP-R-0022A. This specification requires the total mass loss not exceed 1.0% and the proportion of condensable materials be not more than 0.10% when tested per the test method prescribed in ASTM E 595-77. This testing process is discussed in W. Campbell, Jr. and R. Marriott, *Outgassing Data for Selecting Spacecraft Materials,* NASA Reference Publication 1124 Revised (1987), pp. 1–3.

Figure 5:
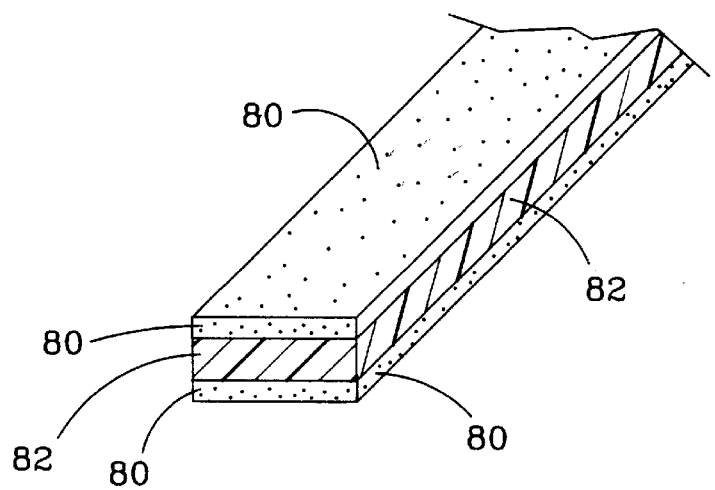
FIG. 5 is a perspective view of the preferred adhesive film used in the present invention.

The preferred adhesive film for the particle getter described herein is Double-Coated Film Tape model 415, made by 3M in St. Paul, Minn. This adhesive film, shown in FIG. 5, is tacky on both sides, and comprises an acrylic pressure-sensitive adhesive coating 80 on both faces of a polyester film carrier 82. The film is about 0.10 mm thick, has a paper release liner on one side (not shown), and is available in widths ranging from about 6.35 mm to 1219 mm. This film has been shown to meet the outgassing requirements discussed above, and is qualified for spacecraft use. It has an adhesion strength of about 273 Newtons per meter width (tested per ASTM D3330). This type of film has previously been used as a normal adhesive tape to mount components, as discussed above. However, the present inventors have discovered it to be very effective for capturing various types of particles that might be expected to be found near electronic circuitry, including gold and silver ribbon, aluminum shavings, wire cuttings, washers and solder balls. It has also been shown to retain captured particles, even under simulated launch-load conditions. Though its outgassing properties make it well-suited to a non-hermetically-sealed application, the particle getter is equally useful in a hermetically-sealed environment. For example, although a hybrid package is typically hermetically-sealed, the preferred adhesive film can be adhered to the underside of the hybrid's cover and perform effectively as a particle getter.

Once a particle is captured, it is essential that it be retained; otherwise, damage that might be caused by an errant particle may only be delayed instead of prevented. Experience with the preferred adhesive film has established that it remains tacky for at least 15 years.

Other adhesive films may be used as a particle getter, as long as they meet the adhesion strength requirements of the particular application, as well as any other applicable specifications that may apply, such as an outgassing requirement. A single-sided adhesive film can also serve as a particle getter, but since the getter function requires that a tacky surface be exposed and available for capturing particles, such a single-sided film must either be suspended in the area where it is used, or a portion of the exposed tacky surface must be pressed against a surface to mount the film (as depicted in FIG. 3), reducing its effective area. A single-sided film may be easier to work with, however, than the extremely sticky double-faced film.

Due to the highly tacky nature of the preferred adhesive film, it is recommended that placing the film into the location in which it will be used be one of the final steps in an electronic circuitry enclosure assembly procedure. If installed earlier, the film is likely to capture nearby debris before being put into service within the enclosure; this debris will cover a portion of the exposed tacky surface and reduce the effective area of the film. Having the film in place could also make remaining assembly steps difficult to perform. Furthermore, the film does not have good solvent resistance, so it is preferably installed after any assembly steps requiring the use of solvents.

To install the particle getter, a desired length of adhesive film is pulled from a roll and cut. The exposed tacky side (or a portion thereof, as shown in FIG. 3) is pressed against a mounting surface and the paper release liner peeled off to expose the other tacky side. The preferred adhesive film is very tacky and will stick to virtually anything; for example, in addition to being mounted to a flat surface, the film could be suspended from one or more metal prongs, wooden dowels, plastic fingers, or similar items protruding into the area in which the getter is to be located.

The preferred adhesive film should be installed while the ambient temperature is between about 21 and 38 degrees C. Application to surfaces at temperatures below 10 degrees C. is not recommended because the adhesive becomes too firm to adhere readily. However, once properly applied, low temperature holding is generally satisfactory. The film should also perform adequately at temperatures as high as 65 degrees C.

The film is preferably sized to provide as large an exposed tacky area as is practical, to provide the greatest amount of protection. For example, when applied to the underside of an enclosure lid as shown in FIG. 1, the film should cover a significant portion of the lid, to provide as much area as possible for capturing debris. In this application, it may also be advisable to apply the film to the walls of the enclosure, or even to all the interior surfaces not used for circuitry, if doing so does not adversely affect assembly of the enclosure or the accessibility of the circuitry. A number of strips of film may be used as necessary to obtain adequate coverage.

Affixing a double-coated adhesive film to a surface may result in several air pockets becoming trapped beneath the film. These entrapped air pockets do not appear to have an adverse effect on the functionality of the film as a getter, nor do they cause the film to lift from the surface to which it is mounted. Thus, entrapped air pockets may be safely ignored, or alternately, an air pocket may be pierced to release the trapped air.

One specific application of the particle getter is in providing protection for microwave circuitry that cannot be conformal coated. The circuitry includes a mother board containing a number of sockets; hybrid circuit packages plug into the sockets instead of being connected to the board with solder joints. To maintain the capability of installing and removing hybrid packages, the board is not conformal coated, because a conformal coating may get into the open sockets and interfere with the sockets' ability to hold and make electrical contact with inserted pins. The particle getter, positioned near the circuitry to be protected but not in contact with it, provides an effective protection alternative while allowing free access to the sockets.

An enclosure that uses the particle getter to provide protection from particles is typically constructed of aluminum, with additional platings or coatings applied to the enclosure's exterior surfaces if required by the application. For example, radiation-resistant surfaces are often required on spacecraft, which may be accommodated with, for example, nickel and/or gold plating, special paints, or denser metals. If enclosure protection is provided externally, the enclosure may be made from magnesium. Bulkhead connectors or feedthroughs are typically used to get signals into and out of the enclosure.

While particular embodiments of the invention have been shown and described, numerous variations and alternate embodiments will occur to those skilled in the art. Accordingly, it is intended that the invention be limited only in terms of the appended claims.

We claim:

1. An electronics package, comprising:
   an enclosure having an interior surface within the enclosure,
   an operating electronic circuit mounted to a first region of the interior surface of said enclosure,
   a feedthrough between an interior of the enclosure and an exterior of the enclosure, and
   at least one strip of adhesive film, each of said strips of film having a first tacky portion adhered to a second region of the interior surface of said enclosure and a second tacky portion that is exposed to capture and retain particles that come into contact with said second tacky portion.

2. The electronics package of claim 1, wherein said adhesive film comprises a thin strip of polyester coated on at least one side with an acrylic pressure-sensitive adhesive.

3. The electronics package of claim 1, wherein said adhesive film has an adhesive strength sufficient to capture and retain small particles capable of damaging electronic circuitry.

4. The electronics package of claim 3, wherein said adhesive film has an adhesive strength of at least about 273 Newtons per meter width.

5. The electronics package of claim 1, wherein said adhesive film outgasses in an amount low enough to prevent impairing the functioning of said electronic circuit due to gas recondensing on said circuit.

6. The electronics package of claim 1, wherein said adhesive film outgasses with less than 1% total mass loss and less than 0.1% volatile condensable material.

7. The electronics package of claim 1, wherein said enclosure includes a lid, with at least a portion of said strips of said adhesive film adhered to an underside of said lid, and at least a portion of said strips on said lid exposed for capturing particles.

8. The electronics package of claim 1, wherein said adhesive film is double-faced with opposed tacky faces.

9. The electronics package of claim 8, wherein said enclosure includes a lid and a plurality of said strips of said adhesive film covers the majority of the underside of said lid, with one tacky face of each of the strips on the lid adhered to said lid and their other tacky faces exposed for capturing particles.

10. The electronics package of claim 1, wherein one or more strips of said adhesive film covers the majority of all interior surface of said enclosure not used for electronic circuitry.

11. The electronics package of claim 1, wherein said adhesive film is about 0.10 mm thick.

12. An electronics package, comprising:
    a base,
    a lid mounted to said base to form an electronic circuitry enclosure,
    an electronic circuit mounted to a first region of the base within the enclosure, and
    at least one strip of adhesive film on at least one interior surface of said electronic circuitry enclosure other than the first region of the base, said adhesive film having an exposed tacky portion for capturing and retaining particles within said enclosure, wherein said adhesive film outgasses with less than 1% total mass loss and less than 0.1% volatile condensable material.

13. The electronics package of claim 12, wherein each of said strips of adhesive film has opposed tacky faces, with one or more strips of said adhesive film on the underside of said lid with one of their tacky faces adhered to said lid and their other tacky faces exposed for capturing and retaining particles.

14. The electronics package of claim 12, wherein one or more strips of said adhesive film covers the majority of the interior walls of said enclosure.

15. The electronics package of claim 12, wherein one or more strips of said adhesive film covers a majority of all interior surfaces of said enclosure not used for electronic circuitry.

16. The electronics package of claim 12, wherein said enclosure is aboard a spacecraft and said adhesive film captures and retains debris floating within said enclosure that contacts said film.

* * * * *